United States Patent
Aouini et al.

(10) Patent No.: US 10,680,585 B2
(45) Date of Patent: Jun. 9, 2020

(54) TECHNIQUES AND CIRCUITS FOR TIME-INTERLEAVED INJECTION LOCKED VOLTAGE CONTROLLED OSCILLATORS WITH JITTER ACCUMULATION RESET

(71) Applicant: Ciena Corporation, Hanover, MD (US)

(72) Inventors: Sadok Aouini, Gatineau (CA); Naim Ben-Hamida, Ottawa (CA); Mahdi Parvizi, Kanata (CA)

(73) Assignee: Ciena Corporation, Hanover, MD (US)

( * ) Notice: Subject to any disclaimer, the term of this patent is extended or adjusted under 35 U.S.C. 154(b) by 136 days.

(21) Appl. No.: 15/947,924

(22) Filed: Apr. 9, 2018

(65) Prior Publication Data

US 2019/0312573 A1   Oct. 10, 2019

(51) Int. Cl.
| | | |
|---|---|---|
| *H03K 3/013* | (2006.01) | |
| *H03L 7/083* | (2006.01) | |
| *G01R 29/26* | (2006.01) | |
| *G01R 31/317* | (2006.01) | |
| *H03L 7/099* | (2006.01) | |

(52) U.S. Cl.
CPC ............ *H03K 3/013* (2013.01); *G01R 29/26* (2013.01); *G01R 31/31709* (2013.01); *H03L 7/083* (2013.01); *H03L 7/0995* (2013.01); *H03B 2201/02* (2013.01)

(58) Field of Classification Search
CPC ....... H03K 3/013; H03L 7/083; H03L 7/0995; G01R 31/31709; H03B 2201/02
See application file for complete search history.

(56) References Cited

U.S. PATENT DOCUMENTS

| | | | | |
|---|---|---|---|---|
| 2008/0284530 | A1* | 11/2008 | Pellerano | H03L 7/099 331/1 A |
| 2010/0148751 | A1* | 6/2010 | Okayasu | G01R 29/26 324/76.52 |
| 2010/0214031 | A1* | 8/2010 | Yamamoto | H03L 7/087 331/34 |
| 2014/0035650 | A1* | 2/2014 | Zerbe | H03L 7/06 327/299 |

* cited by examiner

*Primary Examiner* — Jeffrey M Shin
(74) *Attorney, Agent, or Firm* — Clements Bernard Walker; Christopher L. Bernard; Lawrence A. Baratta, Jr.

(57) ABSTRACT

Digital jitter accumulation reduction techniques and circuits are proposed to mitigate jitter accumulation in Voltage Controlled Oscillators (VCOs). In order to reduce jitter accumulation, employing a pair of identical injection locked VCOs is proposed in an interleaved fashion. Further jitter accumulation reductions can be provided by employing a plurality of identical injection locked VCOs selected in a cascading fashion. Yet further jitter accumulation reductions can be provided by resetting the deselected VCO(s).

17 Claims, 7 Drawing Sheets

TECHNIQUES AND CIRCUITS FOR TIME-INTERLEAVED INJECTION LOCKED VOLTAGE CONTROLLED OSCILLATORS WITH JITTER ACCUMULATION RESET

TECHNICAL FIELD

The proposed solution relates to jitter accumulation prevention in voltage controlled oscillators, and in particular to systems, circuits and techniques for time-interleaved injection locked voltage controlled oscillators with jitter accumulation reset.

BACKGROUND

For example, in digital communications, it is known that the phase noise of a Voltage Controlled Oscillator (VCO) is greater at low frequencies with respect to a carrier frequency due to an increase of flicker noise power magnitude at low frequencies. Injection locking allows phase tracking of a reference clock. It is for this reason that VCOs are generally employed locked to a clean reference clock source to filter out low-frequency intrinsic phase noise of the VCO. Due to positive feedback that enables VCOs to oscillate, the noise created by every element in a VCO within a phase locked loop gets amplified over time. This positive feedback noise enhancement is referred to as jitter accumulation and is schematically illustrated in FIG. 1. For the purpose of concise description herein, jitter accumulation can be summarized as a timing uncertainty in VCO output signal transitions, transition timing uncertainty which grows over time.

In particular, injection locked VCOs exhibit jitter accumulation dependent on the effective bandwidth achieved by the injection locking process. Employing a higher reference clock frequency would result in a higher effective bandwidth and better jitter performance. However, a main shortcoming of employing traditional injection locking is the fact that jitter accumulation is directly proportional to the reference clock frequency.

There is a need to reduce jitter accumulation in VCOs for a variety of applications.

SUMMARY

Identical VCOs having the same output frequency and phase are employed to mitigate jitter accumulation. Embodiments of the proposed solution include techniques and circuits employing a pair of time-interleaved injection locked VCOs such that when one VCO is oscillating the other VCO is turned off and vice versa.

In other embodiments, employing a plurality of cascaded injection locked VCOs is proposed.

In yet other embodiments, deselected VCO(s) can be reset to "flush" the accumulated jitter when not in use.

In accordance with an aspect of the proposed solution there is provided a VCO circuit, the circuit comprising: a plurality of VCO branch circuits, each VCO branch circuit employing a reference clock signal to provide a VCO output signal; a multiplexer configured to output one of the plurality of VCO output signals; and a control circuit configured to output the VCO output signal of each VCO branch circuit via round robin selection at the multiplexer and configured to turn off a remaining VCO in at least one deselected VCO branch circuit, wherein accumulated jitter increases over time in each VCO branch circuit and operation of the control circuit limits jitter accumulation below an acceptable threshold $\sigma_{AT}$ via the round robin selection and turn off repeatedly with a period $\Delta T$.

In accordance with another aspect of the proposed solution there is provided a transceiver comprising: a pulse generator providing reference clock signal including a train of pulses at common reference clock frequency; a plurality of VCO branch circuits, each VCO branch circuit employing the reference clock signal to provide a VCO output signal; a multiplexer configured to output one of the plurality of VCO output signals; and a control circuit configured to output the VCO output signal of each VCO branch circuit via round robin selection at the multiplexer and configured to turn off a remaining VCO in at least one deselected VCO branch circuit, wherein accumulated jitter increases over time in each VCO branch circuit and operation of the control circuit limits jitter accumulation below an acceptable threshold $\sigma_{AT}$ via the round robin selection and turn off repeatedly with a period $\Delta T$.

In accordance with another aspect of the proposed solution there is provided a method of operating VCO circuit, the method comprising: injecting a reference clock signal into a plurality of VCO branch circuits, each VCO branch circuit employing the reference clock signal to provide a VCO output signal; and selecting the VCO output signal of each VCO branch circuit round robin fashion via a multiplexer and turning off remaining VCOs in deselected VCO branch circuits, the multiplexer being configured to output one of the plurality of VCO output signals, wherein accumulated jitter increases over time in each VCO branch circuit and jitter accumulation is limited below an acceptable threshold $\sigma_{AT}$ via the round robin selection and turn off repeatedly with a period $\Delta T$.

BRIEF DESCRIPTION OF THE DRAWINGS

The proposed solution will be better understood by way of the following detailed description of embodiments of the invention with reference to the appended drawings, in which.

wherein similar features bear similar labels throughout the drawings. While the sequence described can be of significance, reference to "first", "next", "subsequent", "last", "left to right", "top" and "bottom" qualifiers in the present specification is made solely with reference to the orientation of the drawings as presented in the application and does not imply any absolute spatial orientation.

DETAILED DESCRIPTION

Figure 1:
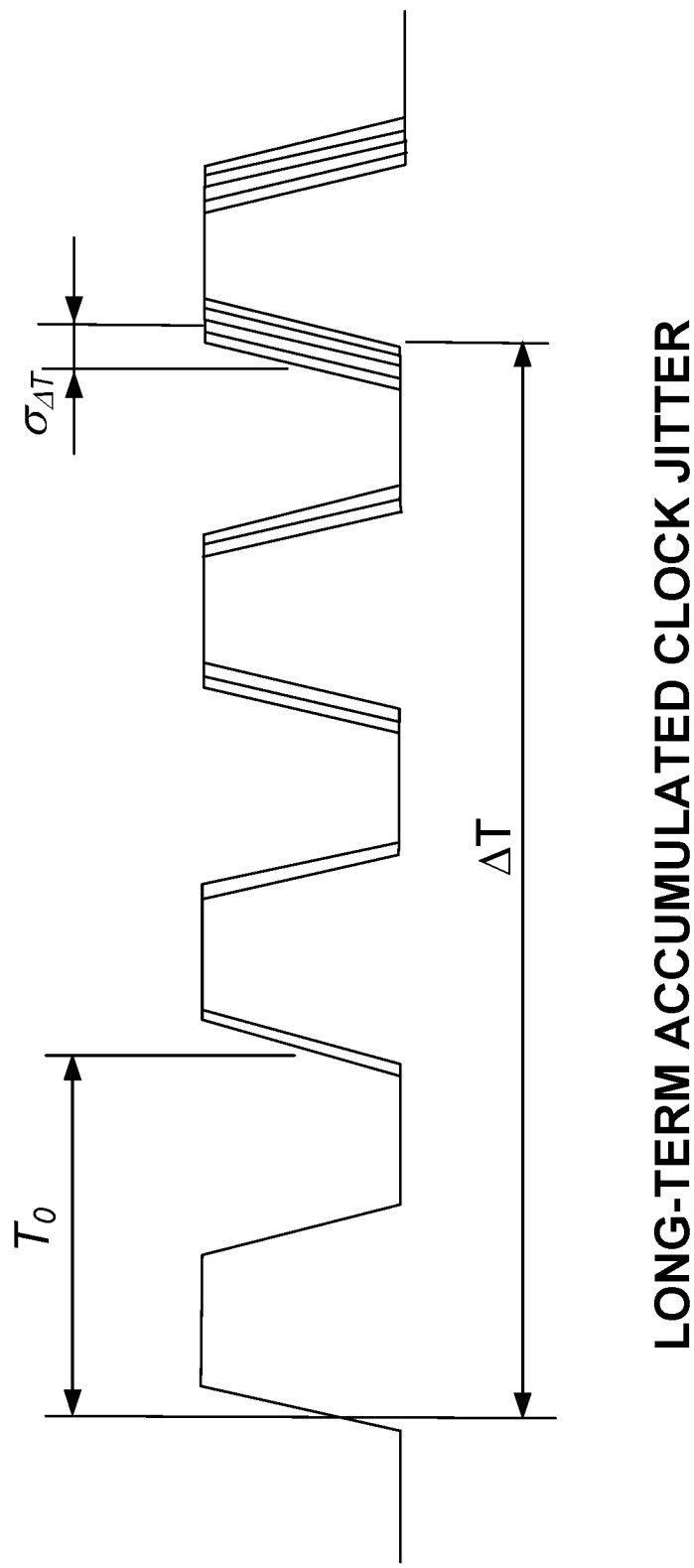
FIG. 1 is schematic plot showing jitter accumulation in an output of a Voltage Controlled Oscillator (VCO)

It is understood that the jitter accumulation illustrated in FIG. 1 is greatly exaggerated in time solely for purposes of simplifying description herein. Specifically, an injection locked VCO operates with desired jitter characteristics after turn-on following a brief stabilization period (not shown). Accumulated clock jitter surpasses an acceptable threshold $\sigma_{AT}$ after a period of operation $\Delta T$. While individual VCO devices poses output frequency, phase and jitter variances, VCOs manufactured in the same batch express similar characteristics. Identical VCOs manufactured on the same wafer express very similar frequency and phase characteristics.

In the following, references to a "subsequent" cycle/transition are understood to refer to a cycle/transition following later in time but not necessarily an immediately sequential cycle/transition. The number of intervening cycles/transitions can be selected by appropriate delay circuits not shown solely for concise description herein. Such delay circuits include frequency dividers, counters, RC delay circuits, cascaded inverters, etc. to implement the "interleaved" and/or "cascaded" operation presented hereinbelow.

In order to reduce or to mitigate jitter accumulation over time, techniques and circuits employing a combination of multiple identical injection locked VCOs having the same output frequency and phase are proposed. Since injection locking allows phase tracking of the reference clock; identical VCOs using the same reference clock will have the same output frequency and phase.

Figure 2:
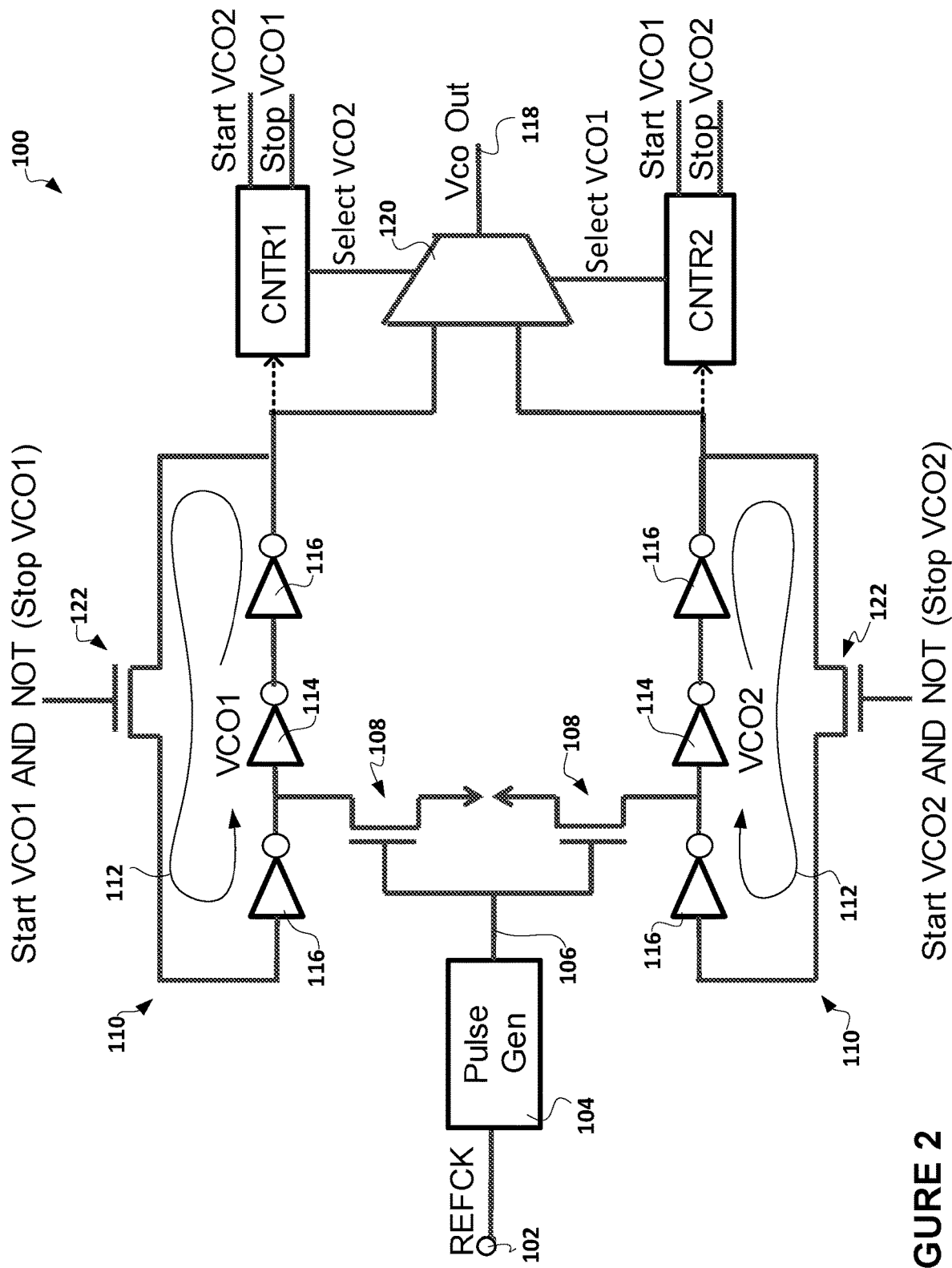
FIG. 2 is a diagram illustrating a circuit schematic in accordance with an embodiment of the proposed solution.

In accordance with an embodiment of the proposed solution, the output of a time-interleaved pair of identical injection locked VCOs is employed in a circuit 100 schematically represented in FIG. 2. The principle of operation of circuit 100 can be summarized as turning off an unselected VCO when the other selected VCO is oscillating and vice versa. This has the effect of providing the least jitter affected output of each VCO for use.

A very stable reference clock 102 operating at a lower sub-harmonic of the VCOs 114 is employed to provide timing in circuit 100. A pulse generator 104 converts the reference clock 102 signal into a train of short pulses 106 at the same frequency as that of the reference clock 102. Pulses 106 are employed to activate a driver 108 in each VCO branch 110 of the overall circuit 100. The output of each driver 108 injects sub-harmonic pulses into an injection locked system 112 for example including a ring VCO 114 made of inverters 116 as injection locked system 112 operates at higher frequency. Injection locking allows phase tracking of reference clock 102. Identical VCOs 114 in different branches 110 of circuit 100 will output a common frequency and phase 118 via multiplexer 120 at the VCO operating frequency.

Figure 3:
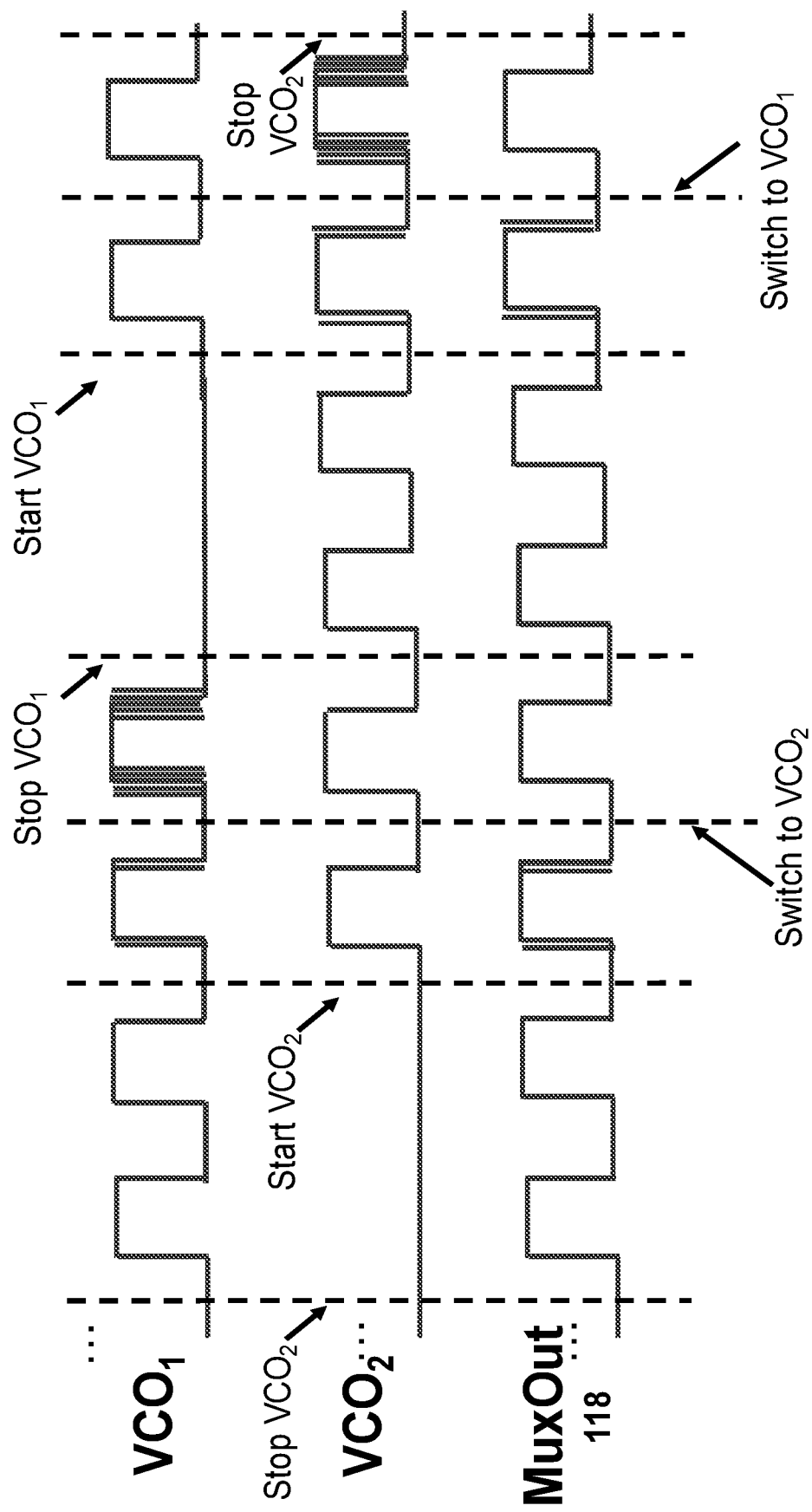
FIG. 3 is a schematic plot representative of a signal diagram of the circuit illustrated in FIG. 2 in accordance with the first embodiment of the proposed solution.

Control signals can be used to disrupt one or the other of the injection locked system 112 in each VCO branch 110 via a corresponding switch 122. The control signals are also used to select the output of the VCO branch circuit 110 currently oscillating for output from the multiplexer 120. FIG. 3 is a schematic plot representative of a timing diagram of the circuit illustrated in FIG. 2 in accordance with the first embodiment of the proposed solution. The top signal trace illustrates the signal output by injection locked system 112 of VCO1 provided to the multiplexer 120, the middle signal trace illustrates the signal output by the injection locked system 112 of VCO2 provided to the multiplexer 120 and the bottom signal trace illustrates the output 118 out of multiplexer 120.

As time progresses from left to right, the injection locked system 112 using VCO1 has recently been turned on (to the left off page), has low accumulated jitter and is selected as the multiplexer output 118. At the same time, the injection locked system 112 for VCO2 is turned off (disrupted by turning off switch 122), VCO2 is in a relaxation state, and the injection locked system 112 for VCO2 does not output a useful signal to multiplexer 120. This mode of operation continues for a number of cycles, both at the reference clock frequency and/or at the VCO frequency, for the time period $\Delta T$ from the Start VCO1 during which the VCO1 output is known to have an accumulated jitter under the acceptable threshold $\sigma_{AT}$. Cycle counting circuitry would be understood by a person of skill in the art and is omitted from illustration in FIG. 2 solely to simplify description herein. Accumulated jitter is expected to increase close to acceptable threshold $\sigma_{AT}$ before expiration of $\Delta T$ from when Start VCO1 was asserted as illustrated in FIG. 1.

Before this first $\Delta T$ expires, VCO2 is started and the phase injection locked system 112 using VCO2 oscillates for a few cycles at the VCO frequency which allows VCO2 to stabilize. Starting VCO2 also begins a second $\Delta T$ period during which VCO2 is regarded to have accumulated jitter below the $\sigma_{AT}$ acceptable threshold. After VCO2 is stabilized, the control circuit(s) switch the multiplexer 120 to select the output of VCO2 as the multiplexer output 118. After a few VCO output cycles at the VCO frequency, or after about one reference clock cycle, VCO1 is stopped by disrupting (122) the injection locked system 112 using VCO1. VCO1 is allowed to relax during most of the second $\Delta T$ period without providing a useful output. This mode of operation continues for a number of cycles, both at the reference clock frequency and at the VCO frequency, for the time period $\Delta T$ from the Start VCO2 during which the VCO2 output is known to have an accumulated jitter under the acceptable threshold $\sigma_{AT}$.

VCO1 is started again close to the end of second $\Delta T$ period while VCO2 is still regarded to have accumulated jitter below the $\sigma_{AT}$ acceptable threshold. After VCO1 stabilizes, the control circuit(s) switch the multiplexer 120 to select the output of VCO1 to provide output 118. After a few VCO output cycles at the VCO frequency, or after about one reference clock cycle, VCO2 is stopped by disrupting (122) the injection locked system 112 using VCO2. The timing diagram repeats endlessly from the left to the right.

Thus, when one VCO 114 is oscillating the other VCO 114 is suppressed and vice versa using alternating injection locked VCOs to mitigate jitter accumulation. Each suppressed VCO 114 enters its relaxation period. Being injection locked, a pair of identical VCOs has a continuous phase output, this results in a continuous output signal 118 with reduced jitter accumulation. The bottom signal trace in FIG. 3 illustrates clipped jitter accumulation from each VCO branch circuit 110 as output by the multiplexer 120. Accumulated jitter increases from a low value at the beginning of each $\Delta T$ period to a maximum value below acceptable threshold $\sigma_{AT}$ towards the end of each $\Delta T$. In accordance with the proposed solution, by toggling between VCOs 114 the accumulated jitter at the output of the multiplexer 120 is limited to a maximum accumulated jitter value below acceptable threshold $\sigma_{AT}$ and does not grow unbounded.

It is understood that FIGS. 2 and 3 are highly schematic. While drivers 108 can be very fast, in practice glitches can be reduced by employing matched drivers 108 to inject the reference clock signal pulses 106 into each VCO circuit branch 110 for oscillation. Such matched drivers 108 can be selected from the same manufacturing run, preferably identical drivers 108 are wafer level manufactured on the same wafer.

Prototypes have been implemented according to the techniques and methods illustrated in FIGS. 2 and 3 and have been experimentally measured. The prototypes show improved performance compared to typical VCO injection locking.

Figure 4:
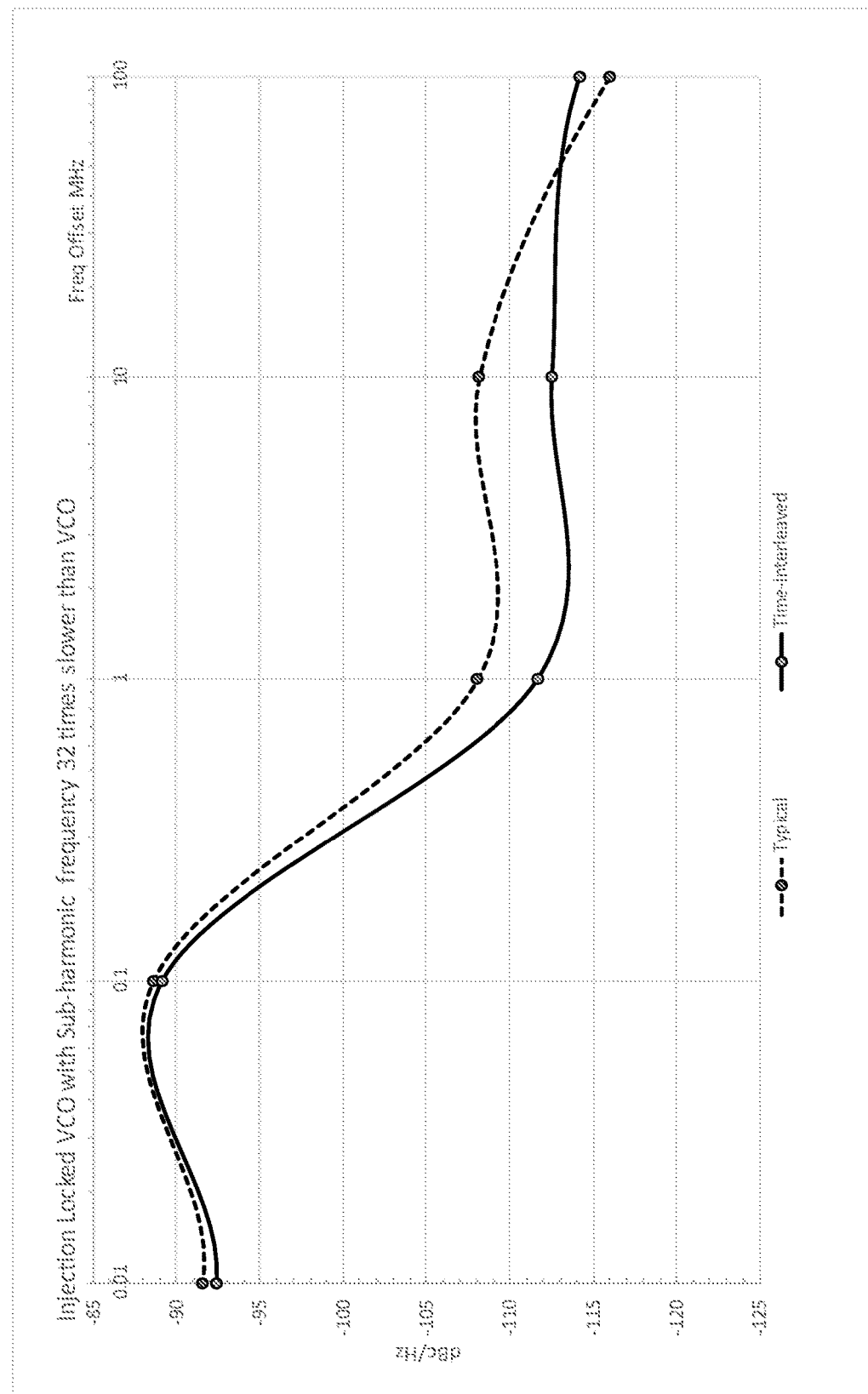
FIG. 4 is a schematic plot showing measured accumulated jitter of a typical injection locked VCO ring oscillator of FIG. 1 compared to measured accumulated jitter of a pair of injection locked VCOs operating in time-interleaved fashion in accordance with the first embodiment of the invention illustrated in FIGS. 2 and 3.

In a first test, a sub-harmonic reference clock 32 times slower than the VCO oscillation frequency was used as the injected signal 106 to a typical VCO ring oscillator (FIG. 1). The measured phase noise is illustrated by the dashed line in FIG. 4. Then, the same injection signal 106 was applied to time-interleaved VCOs as described hereinabove with reference to FIGS. 2 and 3. The in-band phase noise at 1 MHz offset from the carrier improved by about ~4 dB as illustrated by the solid line compared to the dashed line in FIG. 4.

Figure 5:
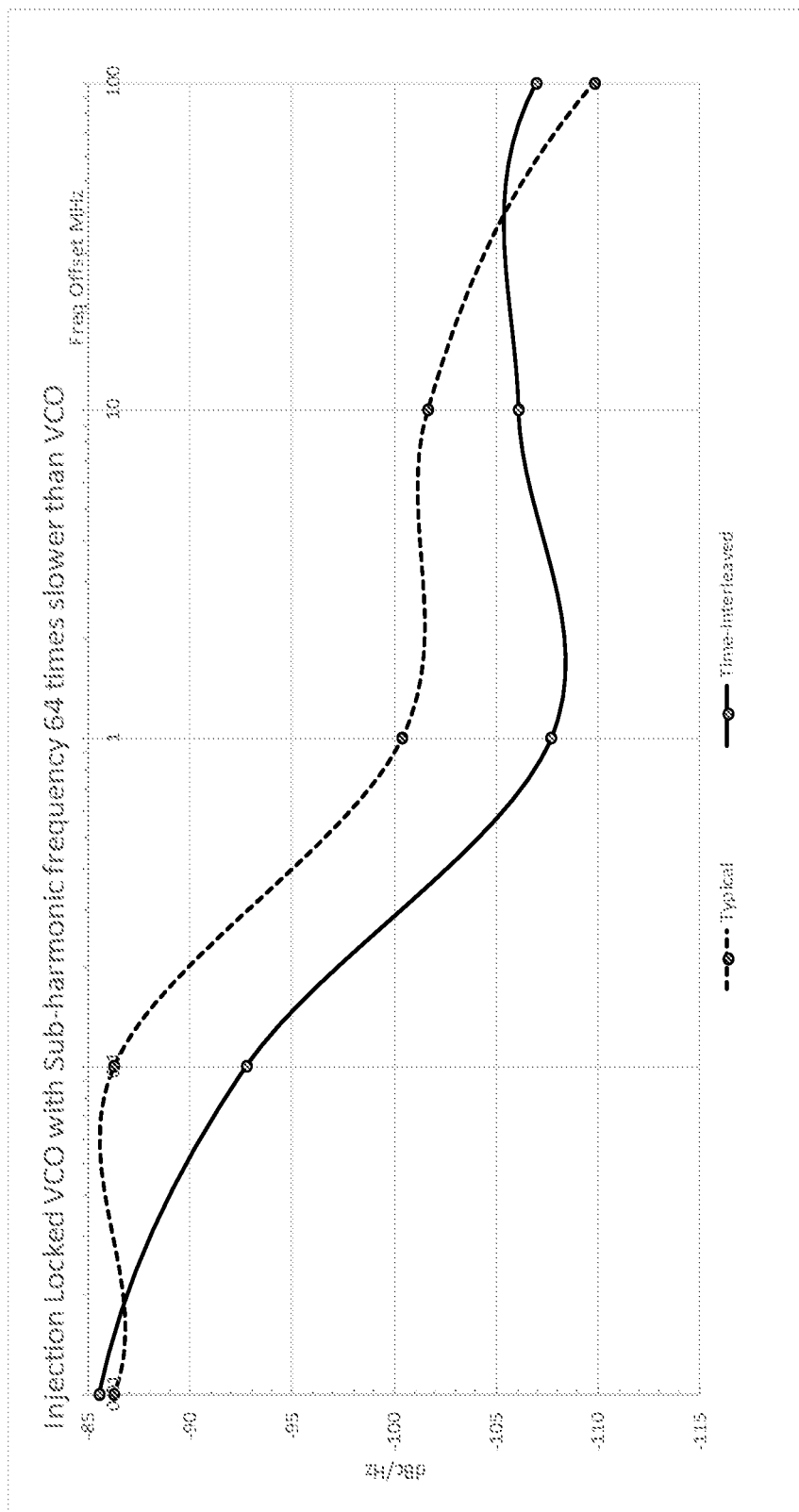
FIG. 5 is a schematic plot showing measured accumulated jitter of another typical injection locked VCO ring oscillator of FIG. 1 compared to measured accumulated jitter of another pair of injection locked VCOs operating in time-interleaved fashion in accordance with the first embodiment of the invention illustrated in FIGS. 2 and 3.

The same experiment was performed again with a sub-harmonic reference clock 64 times slower than the VCO oscillation frequency and a similar performance improvement was observed as illustrated in FIG. 5. The in-band phase noise at 1 MHz offset from the carrier improved by about ~7 dB as illustrated by the solid line compared to the dashed line.

Additionally, it has been observed that inverters 116 and VCO 114 in corresponding injection locked system 112 include parasitic capacitances (not shown) which have been found to affect jitter and ultimately have an effect on the accumulated jitter. In accordance with another embodiment of the proposed solution, reset means are employed to reduce parasitic capacitances in each injection locked system 112.

Figure 6:
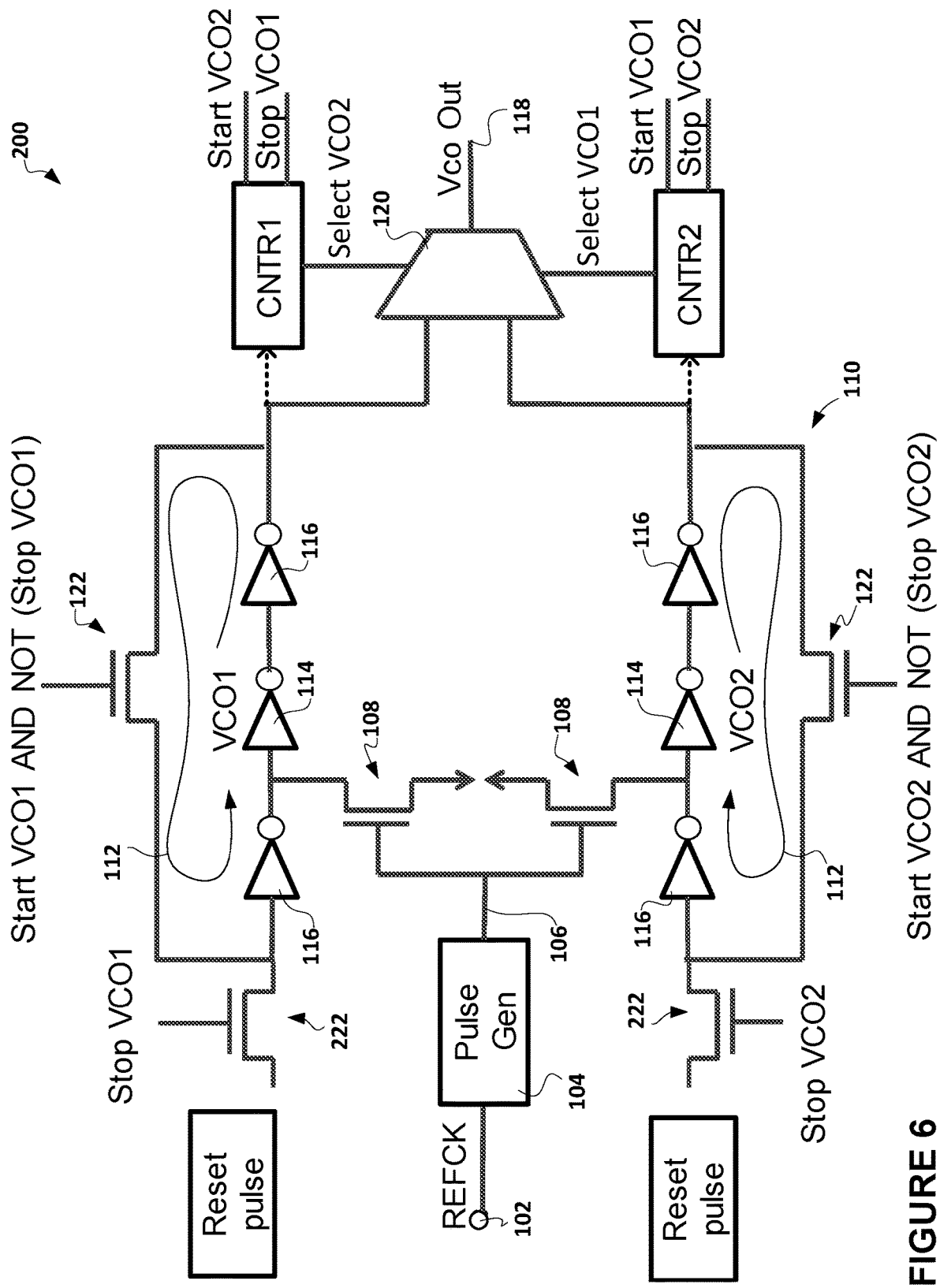
FIG. 6 is a diagram illustrating another circuit schematic in accordance with another embodiment of the proposed solution.
Figure 7:
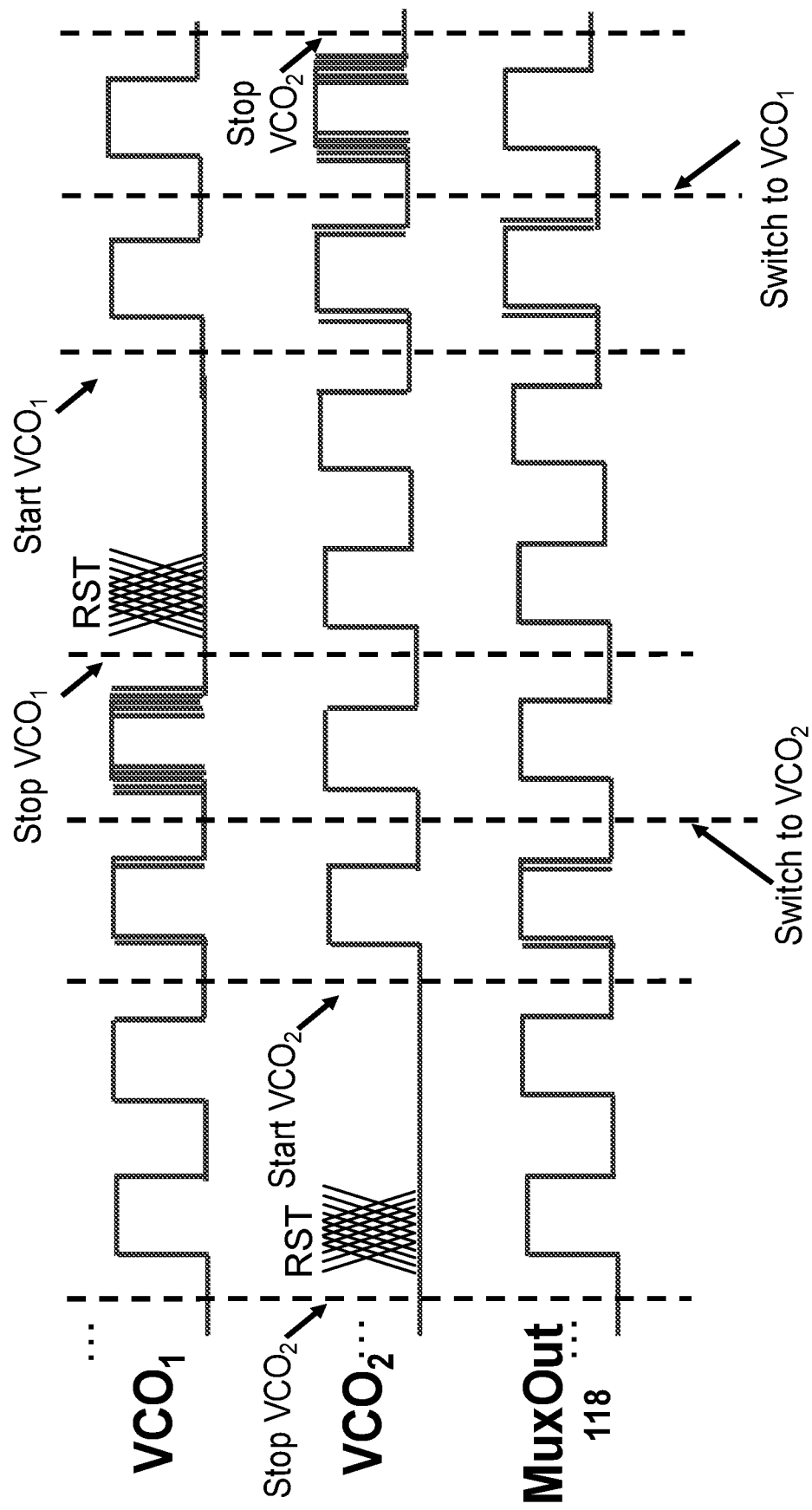
FIG. 7 is a schematic plot representative of a signal diagram of the circuit illustrated in FIG. 6 in accordance with the second embodiment of the proposed solution.

FIG. 6 illustrates a circuit schematic 200 in accordance with the second embodiment of the proposed solution showing time-interleaved identical injection locked VCOs using a reset pulse to "flush" the accumulated jitter. Features in common with circuit schematic 100 retain same labels. Circuit 200 employs switches 222 to inject a reset pulse after the corresponding VCO 114 is turned off to relax. The timing and approximate duration of each reset pulse RST is illustrated in FIG. 7 for each VCO branch 110. It is understood that injection locked system 112 takes some time to stabilize after the reset pulse. Employing the jitter reset pulse RST results in reducing accumulated jitter and therefore in better performance.

While reduced jitter accumulation has been described employing a pair of identical injection locked VCOs in an interleaved fashion, further jitter accumulation reductions can be provided by employing three or more identical injection locked VCOs selected in a cascading fashion.

Benefits can be derived from implementing the proposed solution at wafer-level component manufacture and/or chip-level component production, for example in phase locked loops (PLLs), VCOs, Digital to Analog Converters (DACs), digital clock trees, etc. otherwise having unacceptable jitter to improve the operation of devices and systems including transceivers, modems, line cards, etc. incorporating such components. Additional benefits can be derived from low power component operation and compact component/device design.

While the invention has been illustrated and described with reference to preferred embodiments thereof, it will be recognized by those skilled in the art that various changes in form and detail may be made therein without departing from the spirit and scope of the invention as defined by the appended claims.

What is claimed is:

1. A Voltage Controlled Oscillator (VCO) circuit, the circuit comprising:
a plurality of VCO branch circuits, each VCO branch circuit employing a reference clock signal to provide a VCO output signal;
a multiplexer configured to output one of the plurality of VCO output signals; and
a control circuit configured to cause the multiplexer to select the plurality of VCO branch circuits in a round robin fashion to output the VCO output signal provided by each VCO branch circuit one at a time, the control circuit further configured to actuate at least one switch to turn off a VCO component in at least one deselected VCO branch circuit,
wherein accumulated jitter increases over time after each VCO branch circuit is turned on, and wherein the round robin selection operation and the turn off operation of the control circuit limits jitter accumulation at an output of the multiplexer.

2. A circuit as claimed in claim 1, wherein the plurality of VCO branch circuits comprise identical VCO components manufactured on one wafer.

3. A circuit as claimed in claim 1, wherein each VCO branch circuit comprises an injection locked system including a corresponding driver configured to inject the reference clock signal into the corresponding injection locked system, wherein identical driver components are manufactured on the one wafer.

4. A circuit as claimed in claim 1 comprising a pair of VCO branch circuits wherein round robin selection interleaves the outputs of the pair of VCO branch circuits.

5. A circuit as claimed in claim 3, wherein each injection locked system comprises a ring oscillator including a corresponding switch of the at least one switch and a plurality of inverters, and the control circuit is configured to actuate the corresponding switch to turn off the corresponding VCO in a deselected VCO branch.

6. A circuit as claimed in claim 3, wherein each VCO branch circuit further comprises a reset switch configured to inject a reset signal into the corresponding injection locked system after oscillation in the corresponding VCO branch circuit is turned off, to flush accumulated jitter in the injection locked system.

7. A transceiver comprising:
a pulse generator providing a reference clock signal including a train of pulses at a common reference clock frequency;
a plurality of Voltage Controlled Oscillator (VCO) branch circuits, each VCO branch circuit employing the reference clock signal to provide a VCO output signal;
a multiplexer configured to output one of the plurality of VCO output signals; and
a control circuit configured to cause the multiplexer to select the plurality of VCO branch circuits in a round robin fashion to output the VCO output signal provided by each VCO branch circuit one at a time, the control circuit further configured to actuate at least one switch to turn off a VCO component in at least one deselected VCO branch circuit, wherein accumulated jitter increases over time after each VCO branch circuit is turned on, and wherein the round robin selection operation and the turn off operation of the control circuit limits jitter accumulation at an output of the multiplexer.

8. A transceiver as claimed in claim 7, wherein the plurality of VCO branch circuits comprise identical VCO components manufactured on one wafer.

9. A transceiver as claimed in claim 7, wherein each VCO branch circuit comprises an injection locked system including a corresponding driver configured to inject the reference clock signal into the corresponding injection locked system, wherein identical driver components are manufactured on the one wafer.

10. A transceiver as claimed in claim 9, wherein each injection locked system comprises a ring oscillator including a corresponding switch of the at least one switch and a plurality of inverters, and the control circuit is configured to actuate the corresponding switch to turn off the corresponding VCO in a deselected VCO branch.

11. A transceiver as claimed in claim 9, wherein each VCO branch circuit further comprises a reset switch configured to inject a reset signal into the corresponding injection locked system after oscillation in the corresponding VCO branch circuit is turned off, to flush accumulated jitter in the injection locked system.

12. A transceiver as claimed in claim 7, comprising a pair of VCO branch circuits wherein round robin selection interleaves the outputs of the pair of VCO branch circuits.

13. A method of operating Voltage Controlled Oscillator (VCO) circuit, the method comprising:

injecting a reference clock signal into a plurality of VCO branch circuits, each VCO branch circuit employing the reference clock signal to provide a corresponding VCO output signal; and selecting the VCO output signal of each VCO branch circuit in a round robin fashion via a multiplexer and turning off a VCO component in at least one deselected VCO branch circuit, the multiplexer being configured to output the selected VCO output signal, wherein accumulated jitter increases over time after each VCO branch circuit is turned on, and wherein jitter accumulation is limited via the round robin selection operation and turn off operation.

14. A method as claimed in claim 13, wherein each VCO branch circuit comprises an injection locked system including a corresponding driver, the method comprising injecting the reference clock signal into the corresponding injection locked system.

15. A method as claimed in claim 14, wherein each injection locked system comprises a ring oscillator including a switch and a plurality of inverters, the method further comprises actuating the switch to turn off the corresponding VCO in a deselected VCO branch.

16. A method as claimed in claim 14, wherein each VCO branch circuit further comprises a reset switch, the method comprising injecting a reset signal into the corresponding injection locked system after oscillation in the corresponding VCO branch circuit is turned off to flush accumulated jitter in the injection locked system.

17. A method as claimed in claim 13 comprising a pair of VCO branch circuits wherein round robin selection interleaves the outputs of the pair of VCO branch circuits.

* * * * *